US008619013B2

(12) United States Patent
Kwon et al.

(10) Patent No.: US 8,619,013 B2
(45) Date of Patent: Dec. 31, 2013

(54) DIGITAL-ANALOG CONVERTER, DATA DRIVER, AND FLAT PANEL DISPLAY DEVICE USING THE SAME

(75) Inventors: Oh Kyong Kwon, Seoul (KR); Byong Deok Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1003 days.

(21) Appl. No.: 11/606,570

(22) Filed: Nov. 28, 2006

(65) Prior Publication Data

US 2007/0171176 A1 Jul. 26, 2007

(30) Foreign Application Priority Data

Jan. 20, 2006 (KR) ........................ 10-2006-0006250

(51) Int. Cl.
*G09G 3/36* (2006.01)
*H03M 1/66* (2006.01)

(52) U.S. Cl.
USPC ............... 345/98; 345/99; 345/100; 341/144; 341/150

(58) Field of Classification Search
USPC ........ 345/98–100, 94–95, 103; 341/108, 110, 341/141, 144, 150
See application file for complete search history.

(56) References Cited

U.S. PATENT DOCUMENTS 4,394,662 A 7/1983 Yoshida et al.
5,170,158 A 12/1992 Shinya
5,299,165 A 3/1994 Kimura et al.
5,381,798 A 1/1995 Burrows
6,252,567 B1 6/2001 Budzelaar
6,271,784 B1 8/2001 Lynn et al.
6,310,593 B1 * 10/2001 Nakao ............................ 345/87
6,897,846 B2 5/2005 Youn
6,980,189 B2 12/2005 Maruoka et al.
7,221,349 B2 5/2007 Hashido et al.
7,239,297 B2 7/2007 Tajima et al.
7,542,031 B2 6/2009 Jo et al.

(Continued)

FOREIGN PATENT DOCUMENTS

CN 1287653 A 3/2001
CN 1398391 A 2/2003

(Continued)

OTHER PUBLICATIONS

Japanese Office Action, dated Dec. 16, 2008, for corresponding Japanese Patent Application No. JP 2006-252661.

(Continued)

*Primary Examiner* — Jonathan Horner
(74) *Attorney, Agent, or Firm* — Christie, Parker & Hale, LLP

(57) ABSTRACT

A digital-analog converter (DAC) including: a gray scale generator having a plurality of switches for generating desired gray scale voltages through charge sharing between at least two data lines; a switching signal generator for providing operation control signals for the plurality of switches of the gray scale generator; and a reference voltage generator for generating reference voltages and for providing the reference voltages to the gray scale generator. In one embodiment, the charge sharing used by the DAC is executed by a holding capacitor and a sampling capacitor, and the holding capacitor and the sampling capacitor are formed using respective parasitic capacitance components existing in the at least two data lines, thereby reducing area and power consumption over an existing R-string type of DAC.

21 Claims, 9 Drawing Sheets

(56) References Cited

U.S. PATENT DOCUMENTS

| | | | |
|---|---|---|---|
| 7,605,790 B2 | 10/2009 | Hsu | |
| 7,629,952 B2 | 12/2009 | Burr et al. | |
| 2002/0027799 A1 | 3/2002 | Sakata et al. | |
| 2002/0060657 A1 | 5/2002 | Matsueda et al. | |
| 2002/0154253 A1 | 10/2002 | Cairns et al. | |
| 2002/0158828 A1 | 10/2002 | Isami et al. | |
| 2003/0030614 A1 | 2/2003 | Tajima et al. | |
| 2003/0146896 A1* | 8/2003 | Sekine | 345/98 |
| 2004/0125422 A1 | 7/2004 | Wang et al. | |
| 2004/0174448 A1 | 9/2004 | Azami | |
| 2004/0207779 A1 | 10/2004 | Herrmann | |
| 2005/0001799 A1 | 1/2005 | Kim | |
| 2005/0259064 A1 | 11/2005 | Sugino et al. | |
| 2006/0092121 A1 | 5/2006 | Watanabe et al. | |
| 2006/0192740 A1 | 8/2006 | Lim | |
| 2006/0202928 A1 | 9/2006 | Edwards | |
| 2007/0290969 A1 | 12/2007 | Hsu | |

FOREIGN PATENT DOCUMENTS

| | | |
|---|---|---|
| JP | 5-204339 | 8/1993 |
| JP | 06-224768 | 8/1994 |
| JP | 07-199866 A | 8/1995 |
| JP | 10-326089 | 12/1998 |
| JP | 2001-134249 | 5/2001 |
| JP | 2001-215472 | 8/2001 |
| JP | 2002-505828 | 2/2002 |
| JP | 2002-108296 | 4/2002 |
| JP | 2002-202762 | 7/2002 |
| JP | 2003-114415 | 4/2003 |
| JP | 2003-162265 | 6/2003 |
| JP | 2003-228339 A | 8/2003 |
| JP | 2003-344824 | 12/2003 |
| JP | 2004-295103 | 10/2004 |
| JP | 2004-356875 | 12/2004 |
| JP | 2004-361841 | 12/2004 |
| JP | 2005-024821 | 1/2005 |
| JP | 2005-070627 | 3/2005 |
| JP | 2005-134435 | 5/2005 |
| JP | 2005-242294 | 9/2005 |
| JP | 2005-346077 | 12/2005 |
| JP | 2006-030921 | 2/2006 |
| KR | 2002-0004281 | 1/2002 |
| KR | 10-0375203 | 2/2003 |
| KR | 2003-0057771 | 7/2003 |
| KR | 2003-0061553 | 7/2003 |
| KR | 10-2004-0041810 | 5/2004 |
| KR | 10-2004-0060708 | 7/2004 |
| KR | 10-2005-0000161 | 1/2005 |
| KR | 10-2005-0116098 | 12/2005 |
| KR | 10-2006-0011509 | 2/2006 |
| KR | 10-2006-0037861 | 5/2006 |
| WO | WO 98/48317 | 10/1998 |
| WO | WO 00/23977 | 4/2000 |
| WO | WO 02/21496 A2 | 3/2002 |
| WO | WO2005/017867 A1 * | 2/2005 |
| WO | WO 2005/017867 A1 | 2/2005 |
| WO | WO 2005/078696 A1 | 8/2005 |

OTHER PUBLICATIONS

SIPO Office action dated Mar. 28, 2008, for Chinese application 2006101687670, with English translation indicating relevance of references cited in the Oct. 2, 2007 IDS (except for U.S. Patent 5,170,158).
Korean Patent Abstracts, Publication No. 1020030057771 A; dated Jul. 7, 2003 in the name of Han Sang Lee, et al.
Search Report dated Jul. 3, 2007, for European patent application No. 07250231.3-2205.
European Patent Office Action, dated Aug. 25, 2008, for corresponding European Patent Application No. 07250231.3.
Korean Patent Abstracts for Registration No. 10-0375203; Publication No. 1020020056354; Date of Publication Jul. 10, 2002 in the name of Kwon.
Korean Patent Abstracts for Publication No. 1020020004281; Date of Publication: Jan. 16, 2002; in the name of Lee, et al.
Korean Patent Abstracts for Publication No. 1020060037861; Date of Publication: May 3, 2006; in the name of Lee.
Patent abstract of Japan for publication No. 05-204339; dated Aug. 13, 1993 in the name of Kazunari Kurokawa et al.
Korean Patent abstract, publication No. 1020040060708 A; dated Jul. 6, 2004 in the name of Chang Gon Kim, et al.
Korean Patent abstract, publication No. 1020030061553 A; dated Jul. 22, 2003 in the name of Seok U. Lee, et al.
European Search Report dated May 15, 2007, for European application 07250524.1.
European Search Report dated Jun. 27, 2007, for European application 07250525.8.
European Search Report dated Aug. 25, 2008, for European application 07250525.8.
SIPO Office action dated Jun. 6, 2008, for Chinese application 200710001990.0, with English translation.
SIPO Office action dated Aug. 8, 2008, for Chinese application 200710004221.6, with English translation.
U.S. Office action dated Jun. 11, 2010, for cross-reference U.S. Appl. No. 11/656,805.
U.S. Office action dated Oct. 18, 2010, for cross-reference U.S. Appl. No. 11/656,805.
U.S. Office action dated Oct. 7, 2010, for cross-reference U.S. Appl. No. 11/700,348.
European Search Report dated Jul. 2, 2007 for European Patent application 07250542.3.
Japanese Office action dated Mar. 23, 2010, for Japanese Patent application 2006-217194.
Japanese Office action dated Sep. 14, 2010, for Japanese Patent application 2006-217194.
U.S. Notice of Allowance dated Feb. 22, 2011, for cross reference U.S. Appl. No. 11/656,805.
Japanese Office action dated Mar. 30, 2010, for Japanese Patent application 2006-199463.
Japanese Office action dated Mar. 23, 2010, for Japanese Patent application 2006-221887.
Japanese Office action dated Sep. 7, 2010, for Japanese Patent application 2006-199463, as well as several Japanese references previously filed in an IDS dated Jun. 3, 2010, and WO 2005/078696, previously filed in an IDS dated Feb. 20, 2009.
U.S. Office action dated Apr. 12, 2011, for cross-reference U.S. Appl. No. 11/700,746, 14 pages.

* cited by examiner

DIGITAL-ANALOG CONVERTER, DATA DRIVER, AND FLAT PANEL DISPLAY DEVICE USING THE SAME

CROSS-REFERENCE TO RELATED APPLICATION

This application claims priority to and the benefit of Korean Patent Application No. 10-2006-0006250, filed on Jan. 20, 2006, in the Korean Intellectual Property Office, the entire content of which is incorporated herein by reference.

BACKGROUND

1. Field of the Invention

The present invention relates to a flat panel display device, and, more particularly, to a digital-analog converter provided in a flat panel display device and a data driver using the digital-analog converter.

2. Discussion of Related Art

A flat panel display device generally includes a display panel, a scan driver, and a data driver. The scan driver sequentially outputs scan driving signals to a plurality of scan lines formed on the display panel, and the data driver outputs R, G, B image signals to data lines on the display panel. Non-limiting examples of a flat panel display device include a liquid crystal display device, a field emission display device, a plasma display panel, a light emitting display device, etc.

FIG. 1 is a block diagram showing a conventional data driver.

Here, the data driver will be described on the assumption that it has n channels.

Referring to FIG. 1, the data driver includes: a shift register unit 110, a sampling latch unit 120, a holding latch unit 130, a digital-analog converter (DAC) 140, and an amplifier 150.

The shift register unit 110 receives a source shift clock (SSC) and a source start pulse (SSP) from a timing controller (not shown), and generates n sampling signals in sequence, while allowing the source start pulse (SSP) to be shifted for every one period of the source shift clock (SSC). To generate the n sampling signals, the shift register unit 110 includes n shift registers.

The sampling latch unit 120 sequentially stores data in response to the sampling signals supplied from the shift register 110 in sequence. Here, the sampling latch unit 120 is provided with n sampling latches for storing n digital data. Also, the respective sampling latches have sizes corresponding to the number of bits of the data. For example, when the data is configured to have k bits, the respective sampling latches are set to have a size of k bits.

The holding latch unit 130 receives and stores the data from the sampling latch unit 120 when a source output enable (SOE) signal is input. Also, the holding latch unit 130 supplies the data stored therein to a DAC 250, when the source output enable (SOE) is input. Here, the holding latch unit 130 is provided with n holding latches for storing n data. Also, the respective holding latches have sizes corresponding to the number of bits of the data. For example, the respective holding latches are set to have a size of k bits for storing the data having k bits.

The DAC 140 generates an analog signal corresponding to the bit value of the input digital data, and the DAC 140 selects any one of a plurality of gray scale voltages (or gray levels) corresponding to the bit values of the data supplied from the holding latch unit 130, thereby generating an analog data signal.

The amplifier 150 amplifies the digital data converted into the analog signal to a certain or predetermined level and outputs it through data lines on a panel.

As such, the data driver of FIG. 1 outputs one data per one horizontal period. That is, after the data driver samples and holds one digital R, G, B data (or one set of R, G, B data) during one horizontal period, it converts them into analog R, G, B data and amplifies and outputs them at a certain or predetermined width. In addition, when the holding latch unit 130 holds the R, G, B data corresponding to $n^{th}$ column line, the sampling latch unit 120 samples the R, G, B data corresponding to $n+1^{th}$ column line.

FIG. 2 is a block diagram showing the DAC 140 shown in FIG. 1 according to a related art.

Referring to FIG. 2, the DAC 140 includes: a reference voltage generator 142, a level shifter 144, and a switch array 146.

As shown in FIG. 2, the DAC 140 uses a reference voltage generator 142 having R-strings R1, R2, . . . Rn for generating correct gray scale voltages and/or gamma-corrections, and includes a ROM type of a switch array 146 for selecting the voltages generated through the reference voltage generator 142.

The DAC 140 includes a level shifter for converting and providing a voltage level for digital data input through the sampling latch unit (120 in FIG. 1) to the switch array 146.

The DAC 140 has a disadvantage because power consumption is increased due to a static current of the R-strings. In order to overcome this disadvantage, an approach has been developed in which the R-strings are designed with large resistance values for reducing the static current flowing into the R-strings, and in which the desired gray scale voltages are applied to the respective data lines by using an analog buffer in the respective channels as the amplifier 150. However, this approach has a disadvantage because image quality is deteriorated due to the output voltage difference between channels, when threshold voltages and mobility of certain transistors constituting portions of the analog buffer are not uniform.

Also, in implementing a gray scale of 6 bits, 6·64 switches for selecting one of 64 gray scale voltages (or gray levels) should be built in the respective channels, causing a disadvantage in that circuit area is greatly increased. In an embodiment of the prior art, the area of a DAC implementing the gray scale of 6 bits occupies more than half of the area of a data driver.

As the bits of a gray scale (or the number of gray levels) are increased, even more circuit area may be need. For example, in implementing a gray scale of 8 bits, the circuit area of a data driver can be increased to more than four times the circuit area of the DAC implementing the gray scale of 6 bits.

Also, recently, a flat panel display device using a system on panel (SOP) process that uses polycrystalline silicon TFTs to integrate driver(s), etc., along with a display region on a substrate has been developed. The above described disadvantages of the conventional DAC, i.e., the problems of power consumption and/or area usage, and the problem of implementing the analog buffer as the amplifier, become even more pronounced, when the flat panel display device is implemented using the SOP process.

SUMMARY OF THE INVENTION

It is an aspect of the present invention to provide a digital-analog converter (DAC), a data driver, and a flat panel display device using the same that can generate a desired gray scale voltage through charge sharing between at least two data lines of a plurality of data lines provided on a panel of the display device to remove an R-string, a decoder, and a switch array of a conventional DAC and to remove an analog buffer provided in a rear end of the conventional DAC as an amplifier, thereby minimizing circuit area and power consumption of the DAC of the present invention and improving a yield thereof.

According to a first embodiment of the present invention, there is provided a flat panel display device including: a display region having a plurality of pixels connected with a plurality of scan lines arranged in a first direction and a plurality of data lines arranged in a second direction; a data driver for supplying analog gray scale voltages to the plurality of pixels; and a scan driver for supplying scan signals to the scan lines, wherein the data driver generates the analog gray scale voltages corresponding to the digital data input through charge sharing between the at least two data lines and provides the analog gray scale voltages to corresponding ones of the plurality of pixels.

According to the second embodiment of the present invention, there is provided a data driver including: a shift register unit for providing sampling signals by generating at least one shift register clock; a sampling latch unit for sampling and latching digital data having a plurality of bits input by receiving the sampling signals for every column line; a holding latch unit for simultaneously receiving and latching digital data latched in the sampling latch unit, and for converting and outputting the digital data in a serial state for every channel; and a digital-analog converter for generating analog gray scale voltages to correspond to bit values of the digital data supplied from the holding latch unit in a serial state and outputting the gray scale voltages to the data lines.

According to the third embodiment of the present invention, there is provided a digital-analog converter including: a gray scale generator having a plurality of switches for generating desired gray scale voltages through charge sharing between at least two data lines; a switching signal generator for providing operation control signals for the plurality of switches of the gray scale generator; and a reference voltage generator for generating reference voltages and for providing the reference voltages to the gray scale generator.

According to the fourth embodiment of the present invention, there is provided a data driving method of a flat panel display device including: serially inputting each of a plurality of bits of digital data; executing charge sharing for a plurality of periods during which each of the plurality of bits of the digital data (e.g., k bits) is input; and applying a result of the charge sharing executed at a last one of the plurality of periods to corresponding ones of the pixels through a plurality of data lines as final gray scale voltages.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

Figure 3:
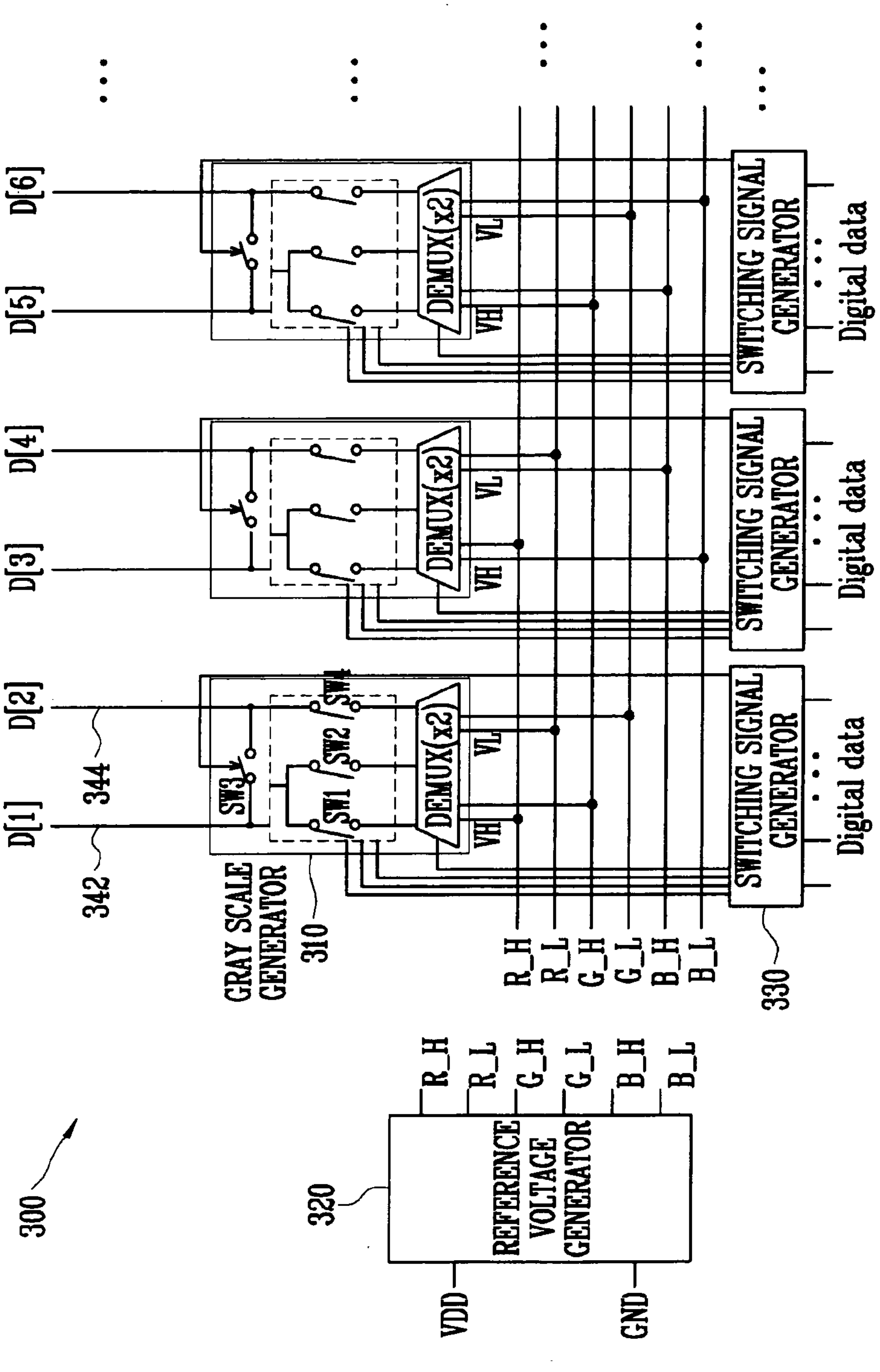
FIG. 3 is a block diagram showing a DAC according to an embodiment of the present invention.

FIG. 3 is a block diagram showing a digital-analog converter (DAC) 300 according to an embodiment of the present invention.

In one embodiment, the DAC 300 is provided in a data driver of a flat panel display device.

In one embodiment, the DAC 300 uses parasitic capacitance components existing in at least two data lines of a plurality of data lines provided on a panel of a flat panel display device as a sampling capacitor and a holding capacitor, thereby generating analog gray scale voltages (or gray levels or gray scale signals) corresponding to digital data input through charge sharing between the at least two data lines and providing the gray scale voltages to corresponding pixels.

As shown in FIG. 3, the respective parasitic capacitance components existing in the neighboring two data lines are used as the sampling capacitor and the holding capacitor; however, the present invention is not thereby limited.

For example, instead of using the two neighboring data lines as the sampling capacitor and/or the holding capacitor, the present invention can use the sum values of the parasitic capacitance components existing in two or more data lines as the sampling capacitor and/or the holding capacitor and/or can also use the respective parasitic components existing in the two or more data lines receiving the same colors of data as the sampling capacitor and/or the holding capacitor.

Referring to FIG. 3, the DAC 300 according to an embodiment of the present invention includes: a gray scale generator 310 for executing the charge sharing (or sharing of charges) between first data lines 342 and second data lines 344, respectively; a switching signal generator 330 for providing operation control signals for a plurality of switches provided in the gray scale generator 310; and a reference voltage generator 320 for generating reference voltages and providing them to the gray scale generator 310.

The first and second data lines 342, 344 are applied with certain or predetermined gray scale voltages and provide the gray scale voltages to corresponding or predetermined pixels connected to the data lines 342, 344. Also, the first and second data lines 342, 344 are used to provide parasitic capacitance components existing in the data lines 342, 344 themselves.

In general, the data lines can be modeled in the form of a plurality of resistors and capacitors that are connected, and therefore the capacitance values of the overall data lines can also be modeled or standardized with certain or predetermined values depending on the panel size, etc.

One embodiment of the present invention uses the respective capacitance components existing in the two neighboring data lines 342, 344 as the sampling capacitor and the holding capacitor, thereby generating analog gray scale voltages corresponding to a digital data input through the charge sharing between the data lines and providing the gray scale voltages to the corresponding data lines.

However, since the embodiment shown in FIG. 3 uses the parasitic capacitance components existing in the neighboring data lines, that is, in the data lines receiving different colors of data, the gray scale generator 310 is provided with a demultiplexer 316 to differentiate the reference voltages for every data line.

This is because the neighboring data lines may receive the data corresponding to different colors; and the reference voltages may be different for every red, green, and blue (R, G, B) color.

In one embodiment, when using the parasitic capacitance components existing in two or more data lines receiving only the same colors of data as the sampling capacitor and/or the holding capacitor, the demultiplexer 316 is not needed in the gray scale generator 310.

Figure 4:
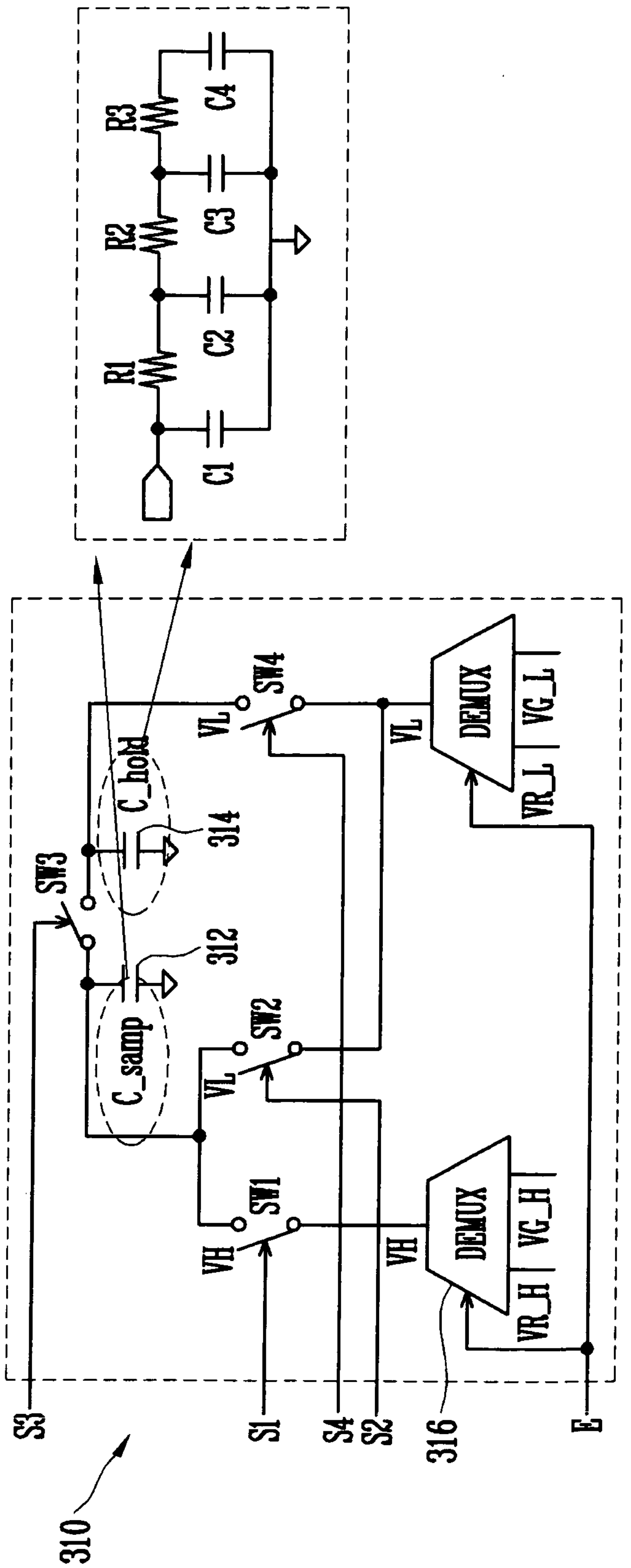
FIG. 4 is a block diagram showing a gray scale generator of the DAC of FIG. 3.
Figure 5:
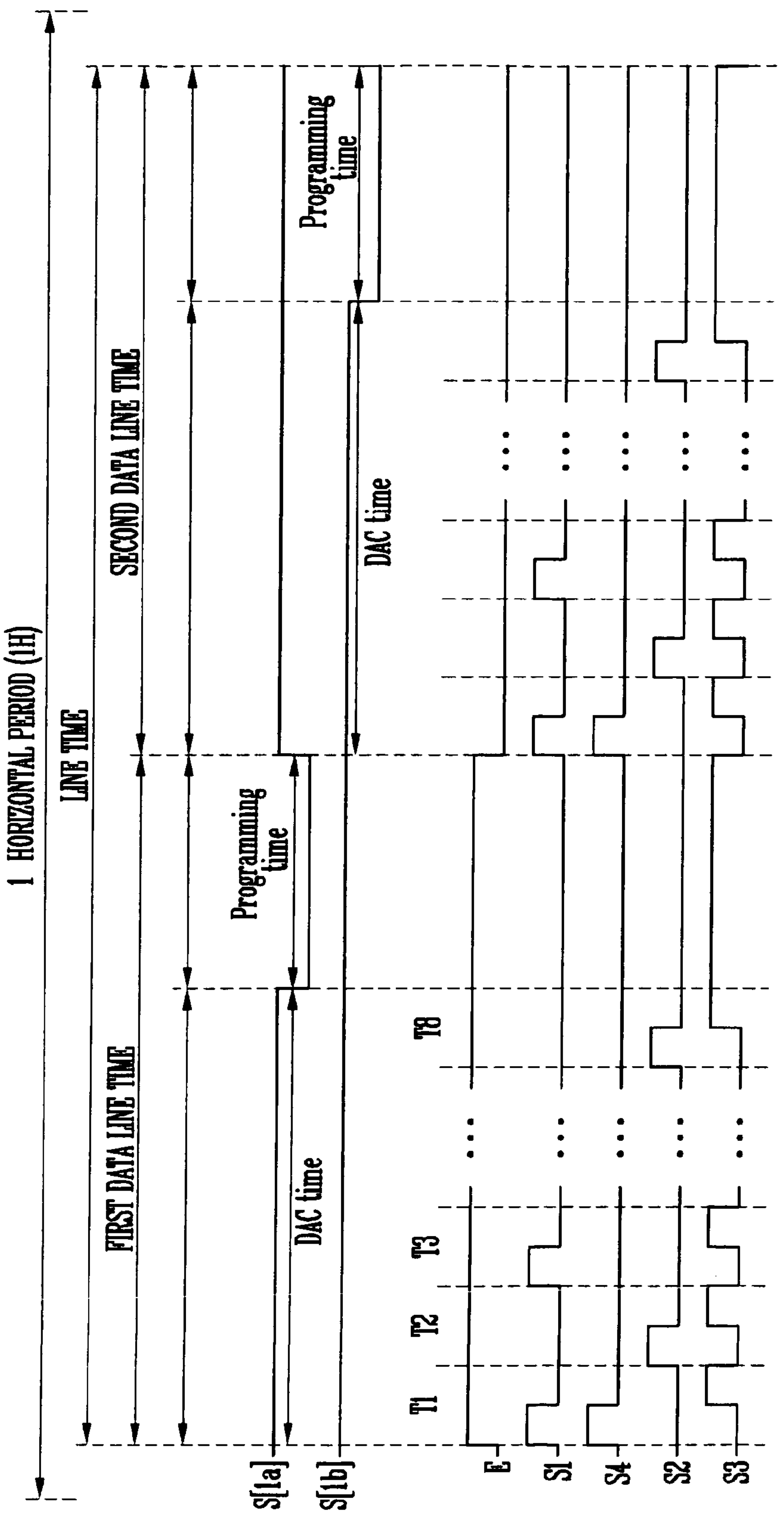
FIG. 5 is a signal waveform diagram showing an example of digital data input to the gray scale generator shown in FIG. 4.

FIG. 4 is a block diagram showing the gray scale generator 310 in more detail, and FIG. 5 is a signal waveform diagram showing one example of digital data input to the gray scale generator 310.

Figure 6:
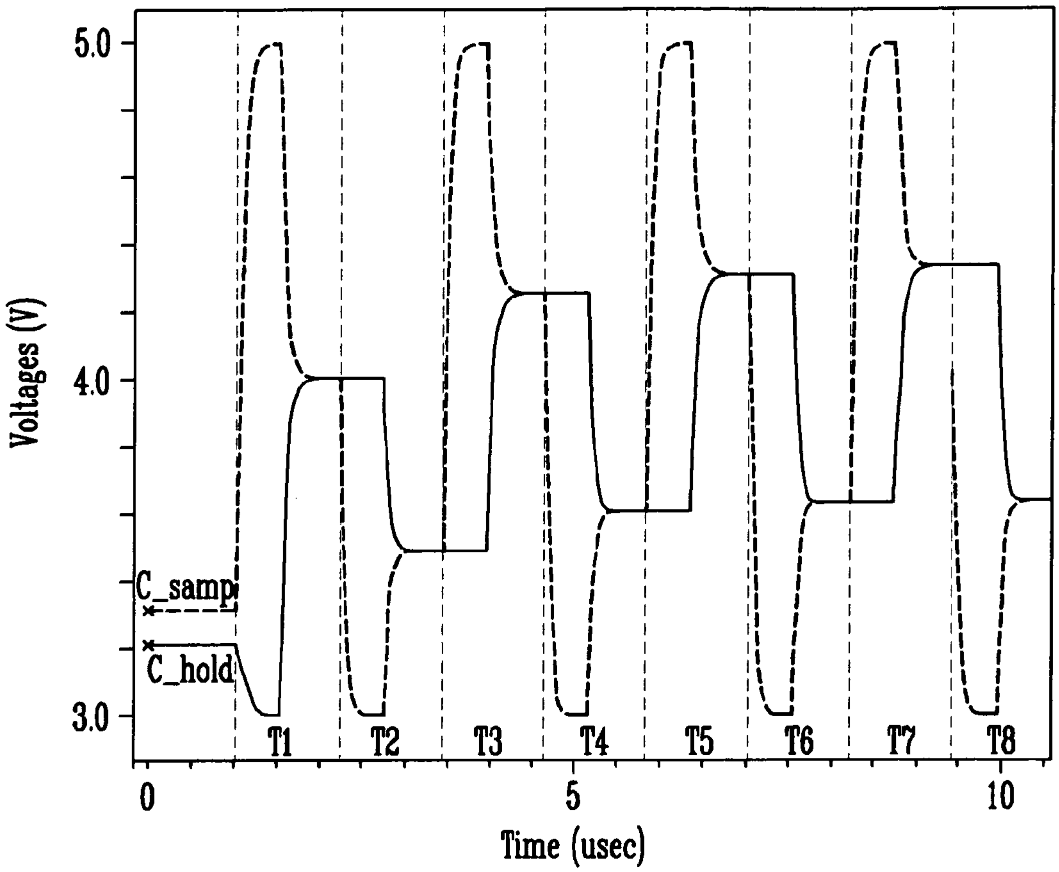
FIG. 6 is a simulation waveform diagram showing outputs of the gray scale generator for the inputs shown in FIG. 5.
Figure 7A:
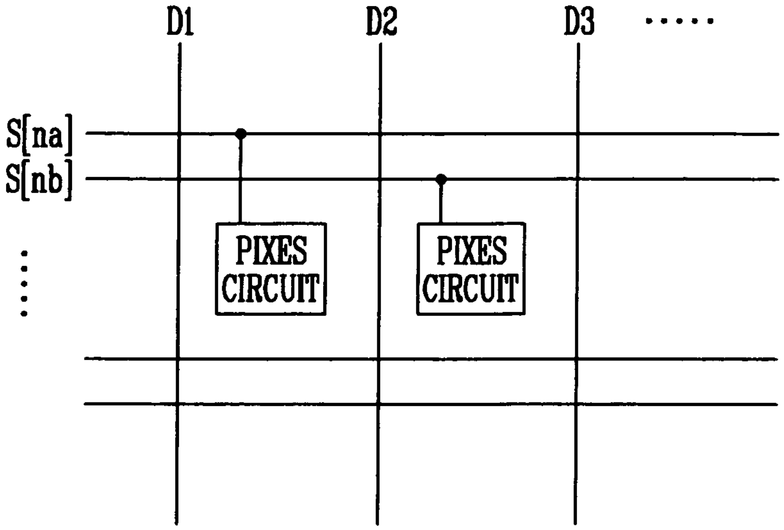
FIGS. 7A and 7B are diagrams showing embodiments of pixel regions in a flat panel display device having the DAC shown in FIG. 3.
Figure 7B:
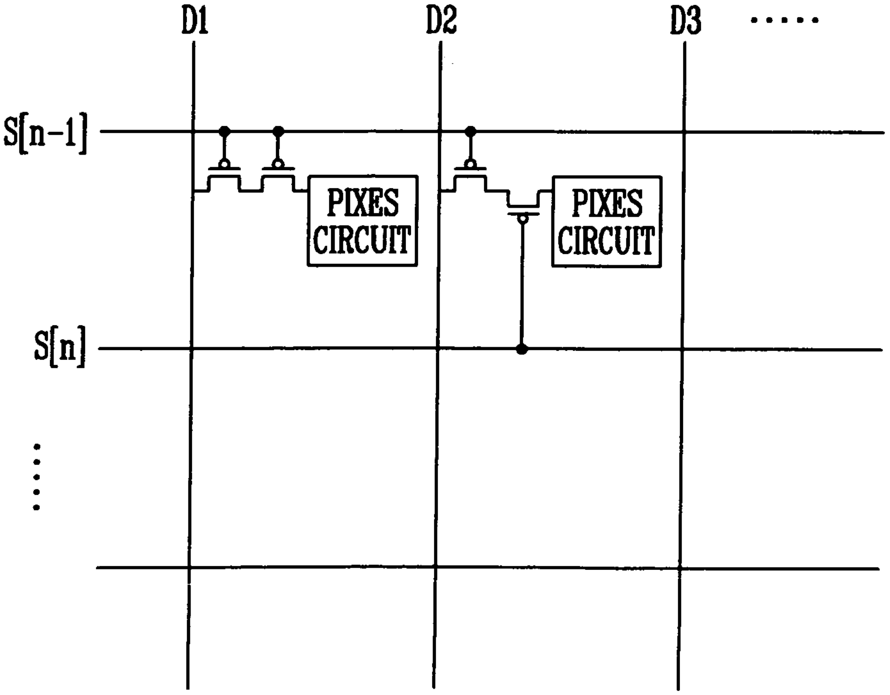

Also, FIG. 6 is a simulation waveform diagram showing outputs of the gray scale generator 310 for the inputs shown in FIG. 5. FIGS. 7A and 7B are diagrams showing embodiments of display regions in a flat panel display device having the DAC 300.

One embodiment of the present invention drives the flat panel display device using a 1:2 demuxing method by generating the gray scale voltage corresponding to one data line using two neighboring data lines. Therefore, as shown in FIG. 5, the time that the respective data lines are driven can be reduced to a half of an existing driving time (or a conventional driving time).

As a result, the scan lines S[n] are connected to each pixel in the flat panel display device including the DAC 300, and two scan lines S[na], S[nb] of the scan lines S[n] are being used for every pixel, as shown in FIG. 5 and FIG. 7A. Therefore, a line time that the scan signal applies to the scan line can be reduced to a half of an existing line time (or a conventional line time).

To put it another way, the gray scale voltage corresponding to the pixel connected to a first scan line S[1a] is generated and applied in the first line time and the gray scale voltage corresponding to the pixel connected to the second scan line S[1 b] is generated and applied in a second line time so that the sum of the two line times becomes (or can be referred to as) an existing line time. Here, the line time corresponds to the period within one horizontal period 1H.

In addition, for each data line time, the time that the gray scale voltages corresponding to the input digital data are generated becomes a DAC time, and the time that the generated gray scale voltages are applied to the corresponding pixels becomes a programming time.

Therefore, as in shown in FIG. 5, the scan signals provided to the respective scan lines are provided as signals turning on the pixel only in the period corresponding to the programming time, that is, the signals having a low level (or a low voltage level).

This describes the embodiment of FIG. 3, that is, the case of generating the gray scale voltage corresponding to one data line by using the two neighboring data lines.

In the case of using the sum values of the respective parasitic capacitance components existing in two or more data lines, that is, k (k≥2) data lines as the sampling capacitor and/or the holding capacitor, the line time that the scan signal applies to the scan line is reduced to 1/k of the existing line time and the scan line S[n] connected to each pixel in the flat panel display device uses k number of scan lines for every pixel. However, in this case, there is a problem in that as the data line time is significantly shorted and the number of the scan lines is increased, an aperture ratio is reduced. Therefore, a method using adjacent scan lines adjacent to and above and/or below a reference scan line may be used by adding switch circuits to pixel circuits within each pixel, without adding the number of the scan lines, as shown in FIG. 7B.

Referring to FIG. 4, the gray scale generator 310 includes: a sampling capacitor C_samp 312 formed by parasitic capacitance components in a first data line 342; a holding capacitor C_hold 314 formed by parasitic capacitance components in a second data line 344; a first switch SW1 for controlling a reference voltage at a high level (or at a high voltage level) VH to be supplied to the sampling capacitor 312 depending on the respective bit values of the input digital data; a second switch SW2 for controlling a reference voltage at a low level (or at a low voltage level) VL to be supplied to the sampling capacitor 312 depending on the respective bit values of the input digital data; and a third switch SW3 provided between the sampling capacitor and the holding capacitor for applying the charge sharing between the sampling capacitor 312 and the holding capacitor 314.

Here, the first and second data lines can be modeled by a plurality of resistors R1, R2, R3 and capacitors C1, C2, C3 that are connected as shown, and therefore the respective capacitance values of the overall data lines can be modeled or standardized with certain or predetermined values depending on the panel size, etc.

That is, in one embodiment of the present invention, the first and second data lines are used as the sampling capacitor C_samp 312 for sampling the reference voltage and the holding capacitor C_hold 314 for generating and storing the gray scale voltage through the charge sharing with the sampling capacitor C_samp 312. Also, a fourth switch SW4 connected to the holding capacitor is further provided for initializing the holding capacitor C_hold 314.

Further, the embodiment of the present invention generates the gray scale voltage corresponding to one data line by using the two neighboring data lines and drives the panel using the 1:2 demuxing method. Therefore, each data line transfers image signals corresponding to different colors of R, G, B and since the reference voltages corresponding to each color are different, the reference voltages must be differentiated for every data line to be provided to each data line.

Therefore, as shown, the gray scale generator 310 according to the embodiment of the present invention further includes a demultiplexer 316 for distinguishing and supplying reference voltage for each data line.

That is, the demultiplexer 316 does not supply the reference voltages corresponding to the second data lines when the certain or predetermined gray scale voltages are supplied to the first data lines, and does not supply the reference voltages corresponding to the first data lines when the certain or predetermined gray scale voltages are supplied to the second data lines. Here, two demultiplexers may be provided to supply the reference voltages for every level.

In one embodiment, when using the parasitic capacitance components existing in two or more data lines receiving only the data of the same color as the sampling capacitor and/or the holding capacitor, the demultiplexer 316 is not needed in the gray scale generator 310.

In the embodiment of FIG. 4, the signals S1, S2, S3, S4 and a signal E are provided from the switching signal generator 330 as shown in FIG. 3, and the high level and the low level of reference voltages are provided from the reference voltage generator 320. Here, the signal E is for controlling the operations of the first, second, third, and fourth switches SW1, SW2, SW3, SW4 and the demultiplexer 316.

An operation of the gray scale generator 310 will be described with reference to FIG. 4 and FIG. 5 in more detail below.

First, the sampling capacitor C_samp is set to the high level (VH) or the low level (VL) of the reference voltages depending on the least significant bit (LSB) of the input digital data.

That is, when the least significant bit LSB of the input digital data is 1 (LSB=1), the first switch SW1 is turned on to provide the reference voltage at the high level VH to the sampling capacitor C_samp 312, resulting in the sampling capacitor C_samp 312 being set to the reference voltage at the high level VH. In addition, when the least significant bit LSB of the digital data is 0 (LSB=0), the second switch SW2 is turned on to provide the reference voltage at the low level VL to the sampling capacitor C_samp 312, resulting in the sampling capacitor C_samp 312 being set to the reference voltage at the low level VL. After this, the charge sharing between the sampling capacitor C_samp 312 and the holding capacitor C_hold 314 is made.

According to the embodiments shown in FIG. 5 and FIG. 6, there is described below as an example that the input digital data [d7d6d5d4d3d2d1d0] are [01010101]. Therefore, the LSB of the digital data is 1, resulting in the sampling capacitor C_samp 312 being set to the reference voltage at the high level VH. This is as shown in a simulation graph of FIG. 6.

Also, the holding capacitor C_hold 314 is initialized simultaneously with inputting of the LSB of the sampling capacitor C_samp 312. This is made by turning on the fourth switch SW4.

As shown in FIG. 5, the holding capacitor C_hold 314 is initialized with the reference voltage at the high level VL. That is, by turning on the fourth switch SW4, the reference voltage at the low level VL is provided to the holding capacitor C_hold 314 so that the holding capacitor C_hold 314 is initialized with the reference voltage at the low level VL. This is as shown in the simulation graph of FIG. 6.

However, the present invention is not thereby limited and the holding capacitor C_hold 314 can be initialized with the reference voltage at the high level VH or the reference voltage at the low level VL.

When assuming that the input digital data are 8 bits as shown in FIG. 5 and FIG. 6, the gray scale generator 310 executes the charge sharing between the sampling capacitor C_samp 312 and the holding capacitor C_hold 314 during the 8 periods where the respective bits are input, and the result is that the $8^{th}$ charge sharing that is finally executed becomes the final gray scale voltages that are applied to the corresponding or predetermined pixels through the data lines.

That is, for the input digital data, in the period T1 for receiving the first LSB and the respective periods T2, T3, T4, T5, T6, T7, and T8 for respectively receiving the next bits respectively from the second lower bit to the most significant bit MSB so that the first switch (when the bit value is 1) or the second switch (when the bit value is 0) is turned on depending on the respective bits to store the certain or predetermined reference voltages in the sampling capacitor C_samp 312, and the third switch SW3 is turned on for a certain or predetermined period of the respective periods to apply the charge sharing between the reference voltages stored in the sampling capacitor C_samp 312 and the voltages stored in the holding capacitor C_hold 314.

As a result, the certain or predetermined gray scale voltages corresponding to the digital data input through the charge sharing in the last $8^{th}$ period T8 are generated and provided to the corresponding pixels.

Under the assumption that the 8 bits of the digital data with [01010101] are provided during the first data line time, that is, during the period corresponding to a half of the existing line time, an operation of the embodiment shown in FIG. 5 and FIG. 6 will be described in more detail below.

First, in the first period T1, the LSB of the input digital data [01010101] is 1 and the first switch SW1 is thus turned on so that the reference voltage at the high level VH is stored in the sampling capacitor C_samp 312 to set the sampling capacitor C_samp 312 to the reference voltage at the high level VH.

Also, the holding capacitor C_hold 314 is provided with the reference voltage at the low level VL by turning on the fourth switch SW4 so that it is initialized with the reference voltage at the low level VL.

Therefore, in the certain or predetermined period of the first period, that is, the period of the remaining first period after the first switch SW1 is turned on, the third switch SW3 is turned on so that the voltages stored in the sampling capacitor C_samp 312 and the charges stored in the holding capacitor C_hold 314 are distributed, thereby being converted and stored into the voltages corresponding to a middle level of voltage stored in the respective sampling and holding capacitors 312 and 314.

Next, in the second period T2, since the second lower bit is 0, the second switch SW2 is turned on so that the reference voltage at the low level VL is stored in the sampling capacitor C_samp 312 and in the certain or predetermined period of the second period, that is, in the remaining second period after the second switch SW2 is turned on, the third switch SW3 is turned on so that the voltages stored in the sampling capacitor C_samp 312 and the charges stored in the holding capacitor C_hold 314 are distributed, thereby being converted and stored into the voltages corresponding to a middle level of voltage stored in the respective sampling and holding capacitors.

Next, from the third period to the eighth period T3 to T8, depending on the bits input as in the second period, the first switch SW1 is turned on (when the bit is 1) or the second switch SW2 is turned on (when the bit is 0), resulting in the reference voltage at the high level VH or the reference voltage at the low level VL being stored in the sampling capacitor, respectively. Among the respective periods in the period after the first switch SW1 or the second switch SW2 is turned on, the third switch SW3 is turned on so that the reference voltages stored in the sampling capacitor C_samp 312 and the charges stored in the holding capacitor C_hold 314 are distributed, resulting in the voltages of a middle level being stored in the sampling and the holding capacitors.

As a result, in the last eighth period T8, the voltages distributed in the sampling and holding capacitors finally become the gray scale voltages corresponding to the input digital data, and such gray scale voltages are provided to the corresponding or predetermined pixels connected to the first data lines.

Here, the respective lower ends of the first switch SW1, the second switch SW2, and the fourth switch SW4 are provided with the demultiplexer 316 so that the reference voltages corresponding to the first data lines or the second data lines are divided and provided.

That is, the control signal E of the demultiplexer 316 is provided to the demultiplexer 316 during the first to the eighth periods T1 to T8 where the digital data bits are input in order to provide the gray scale voltage to the first data line.

However, this is limited to the case of using the parasitic capacitance existing in the two neighboring data, and the present invention is not thereby limited. For example, in one embodiment, when using the parasitic capacitance components existing in two or more data lines receiving only the data of the same color as the sampling capacitor and/or the holding capacitor, the demultiplexer 316 is not needed in the gray scale generator 310.

Next, in providing the gray scale voltage to the second data line, the 8 bits of the digital data are provided during the second line time corresponding to the remaining half of the existing line time so that the first to the fourth switches SW1 to SW4 are operated in the period where the each digital data bit is inputted, thereby generating the certain or predetermined gray scale voltages and providing them to the second data lines by the demultiplexer 316.

Here, when the demultiplexer 316 provides the certain or predetermined gray scale voltages to the first data lines, the reference voltages corresponding to the second data lines should not be provided, and when it provides the certain or predetermined gray scale voltages to the second data lines, the reference voltages corresponding to the first data lines should not be provided. The operation of the demultiplexer is controlled by the control signal E as shown FIG. 4 and FIG. 5.

However, the embodiment of FIG. 3 as described above is for the case of using the two neighboring data lines to generate the gray scale voltages corresponding to the data lines.

In the case of using the sum values of the respective parasitic capacitance components existing in two or more data lines, that is, k (k≥2) data lines as the sampling capacitor and/or the holding capacitor, the line time that the scan signals are applied to the scan line is reduced to 1/k of the existing line time and the scan line S[n] connected to each pixel in the flat panel display device uses k number of scan lines for every pixel.

In the DAC 300 according to an embodiment of the present invention, the DAC 300 uses the capacitance components existing in the at least two data lines as the sampling capacitor and the holding capacitor to generate desired gray scale voltages through the charge sharing between the data lines, thereby greatly reducing power consumption over an existing R-string type of a DAC of a related art, and also greatly reducing the DAC area over an existing DAC area of a related art by removing an R-string, a decoder, and a switch array in an existing (or conventional) DAC.

Figure 8:
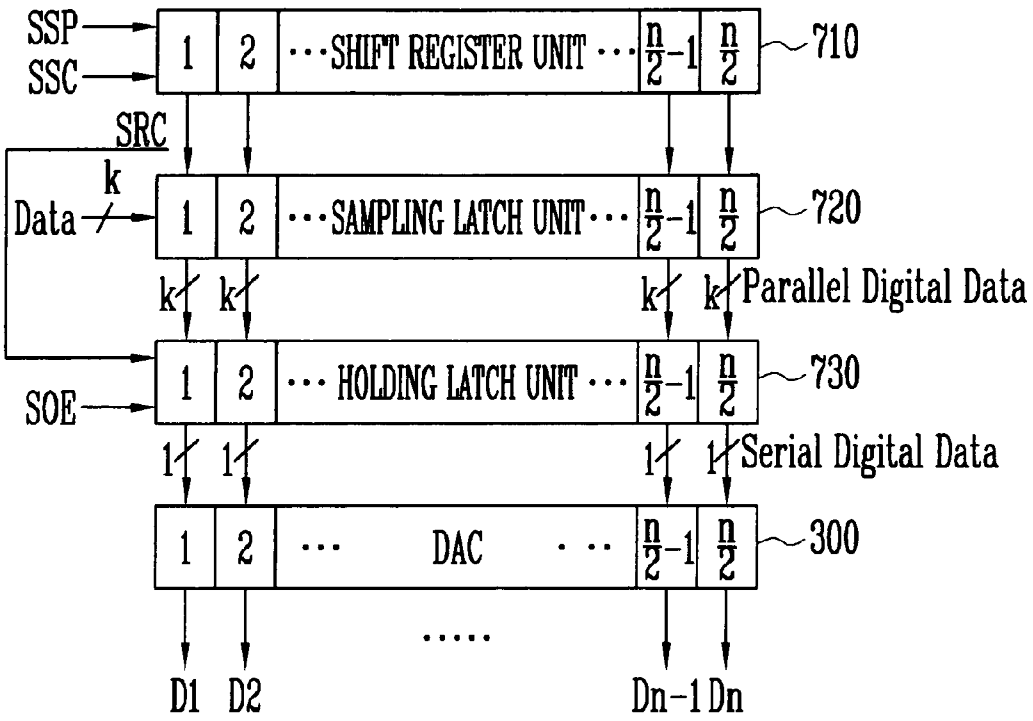
FIG. 8 is a block diagram of a data driver according to an embodiment of the present invention.

Also, the signal generator 330 shown in FIG. 3 functions to generate and provide signals S1, S2, S3, S4, E for controlling the operations of the plurality of switches provided in the gray scale generator 310, wherein the first and second switches SW1, SW2 are determined to be turned on or off depending on the bit values of the input digital data so that the control signals are generated by the bit values of the digital data output in a serial state through the holding latch unit in the data driver as will be described in more detail with reference to FIG. 8.

That is, when the digital data bit value is 1, the switching signal generator 330 generates the control signal S1 for allowing the first switch SW1 to be turned on and provides the control signal S1 to the gray scale generator 310, and when the digital data bit value is 0, the switching signal generator 330 generates the control signal S2 for allowing the second switch SW2 to be turned on and provides the control signal S2 to the gray scale generator.

Also, the fourth switch SW4 should be turned on when the holding capacitor is initialized, and the third switch SW3 should be turned on for a certain or predetermined period of the respective line times, that is, for every period where the respective digital data bits are input. Therefore, since the control signals S3, S4 of the third and fourth switches SW3, SW4 are signals that are repeated for every respective data line time regardless of the input digital data, they can be separately generated from a timing controller and used. This is equally applied to the control signal E for the demultiplexer 316.

FIG. 8 is a block diagram showing a data driver according to an embodiment of the present invention.

However, the data driver includes the DAC 300 as described above with reference to FIG. 3 to FIG. 6 and the detailed description of the DAC 300 (including its structures and operations) will not be provided again in more detail In the embodiment of the present invention, since the gray scale voltage corresponding to one data line is generated by using the two neighboring data lines, it will be described by way of an example that the panel is driven using a 1:2 demuxing method.

Referring to FIG. 8, the data driver includes a shift register unit 710, a sampling latch unit 720, a holding latch unit 730, and a digital-analog converter (DAC) 300.

Figure 1:
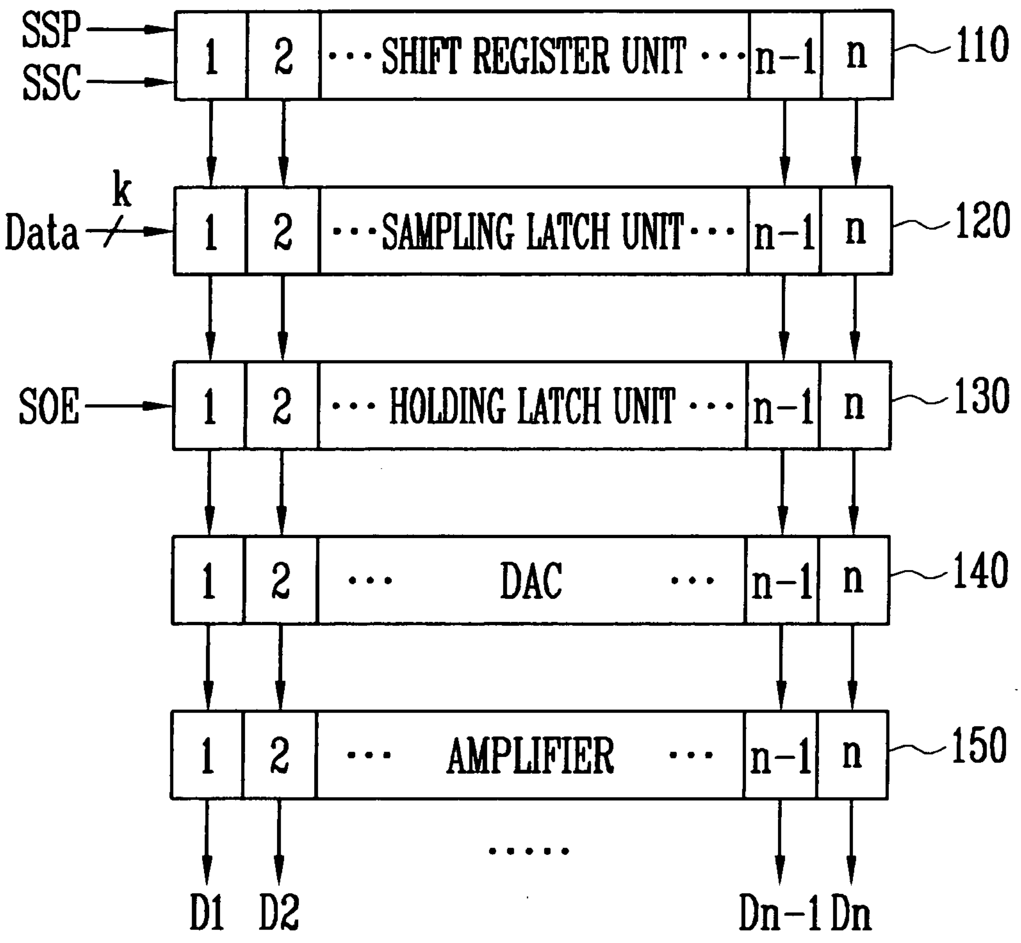
FIG. 1 (RELATED ART)
FIG. 1 is a block diagram showing a conventional data driver.
Figure 2:
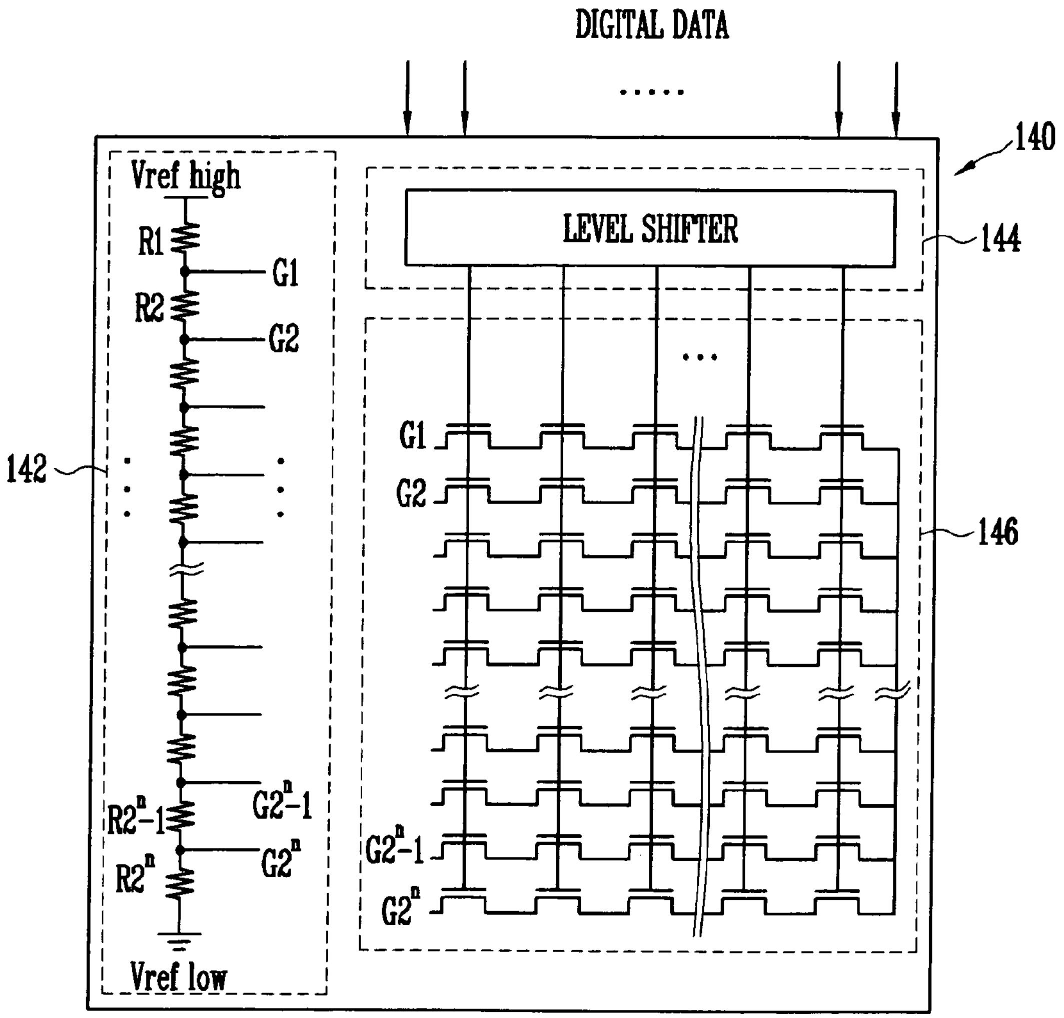
FIG. 2 (RELATED ART)
FIG. 2 is a block diagram showing a digital-analog converter (DAC) of the data driver of FIG. 1.

When the data driver of FIG. 8 is compared with the data driver according to the related art (e.g., shown in FIG. 1), the DAC 300 can be changed such that an analog buffer may not need to be used as an amplifier. As such, the data driver 300 of FIG. 8 has an advantage in that the deterioration of image quality due to the difference of output voltage between channels caused by the analog buffer with non-uniformity (or unevenness) in threshold voltages and mobility can be overcome because the analog buffer does not have to be used as the amplifier.

Also, recently, a flat panel display device using a system on panel (SOP) process that uses polycrystalline silicon TFTs to integrate driver(s), etc., along with a display region on a substrate, has been developed. Therefore, the data driver according to the embodiment of the present invention is capable of overcoming the problems of power consumption and/or area usage, and also overcoming the problem of implementing analog buffer as the amplifier, even when these problems become even more pronounced, when the flat panel display device is implemented using the SOP process.

In FIG. 8, the shift register unit 710 receives a source shift clock (SSC) and a source start pulse (SSP) from a timing controller (not shown), and generates a shift register clock (SRC) as n/2 sampling signals in sequence, while allowing the source start pulse (SSP) to be shifted for every one period of the source shift clock (SSC). Here, the shift register unit 210 includes n/2 shift registers.

That is, in the embodiment of the present invention as described above, the gray scale voltage corresponding to one data line is generated by using the two neighboring data lines, and the panel of the display device is driven using a 1:2 demuxing method.

The sampling latch unit 720 sequentially stores data in response to the sampling signals supplied from the shift register 710 in sequence. Here, the sampling latch unit 720 is provided with n/2 sampling latches for storing n digital data. Also, the respective sampling latches have sizes corresponding to the number of bits of the data. For example, when the data is configured to have 8 bits, the respective sampling latches are set to have the size of 8 bits.

That is, the sampling latch unit 720 sequentially stores the input data and then outputs the 8 bits of the digital data to the holding latch unit 730 in a parallel state.

The holding latch unit 730 receives and stores the data from the sampling latch unit 720 when a source output enable (SOE) signal is input. That is, the holding latch unit inputs and stores the 8 bits of the digital data provided in a parallel state.

Also, the holding latch unit 730 supplies the data stored therein to the DAC 740, when the source output enable (SOE) signal is input. Here, the holding latch unit 730 is provided with n/2 holding latches for storing n data. In addition, the respective holding latches have sizes corresponding to the number of bits of the data. For example, the respective holding latches are set to have the size of 8 bits for storing the 8 bits of the data.

In one embodiment of the present invention, when the 8 bits of the digital data stored in the holding latch unit 730 is output to the DAC 300, it is converted and output in a serial state.

Here, the holding latch unit 730 receives the shift register clock signal (SRC) generated from the shift register and converts the 8 bits of the digital data into a serial state through the clock signal and outputs the serial digital data to the DAC 300, as shown.

The DAC 300 generates analog signals corresponding to the bit values of the input digital data, and the DAC 300 selects any one of a plurality of gray scale voltages (or gray level signals or gray levels) corresponding to the bit values of the data supplied from the holding latch unit 730, thereby generating the analog data signals and outputting them to the respective data lines.

In the present invention, the DAC 300 uses the parasitic capacitance components existing in the at least two data lines of the plurality of data lines provided on the panel as the sampling capacitor and the holding capacitor, thereby generating the analog gray scale voltages corresponding to the digital data input through the charge sharing between the data lines and providing the gray scale voltages to the corresponding pixels. The constitution and the operation of the DAC 300 have been described above with reference to FIG. 3 to FIG. 6, and the detailed description thereof will thus not be provided again in more detail.

Figure 9:
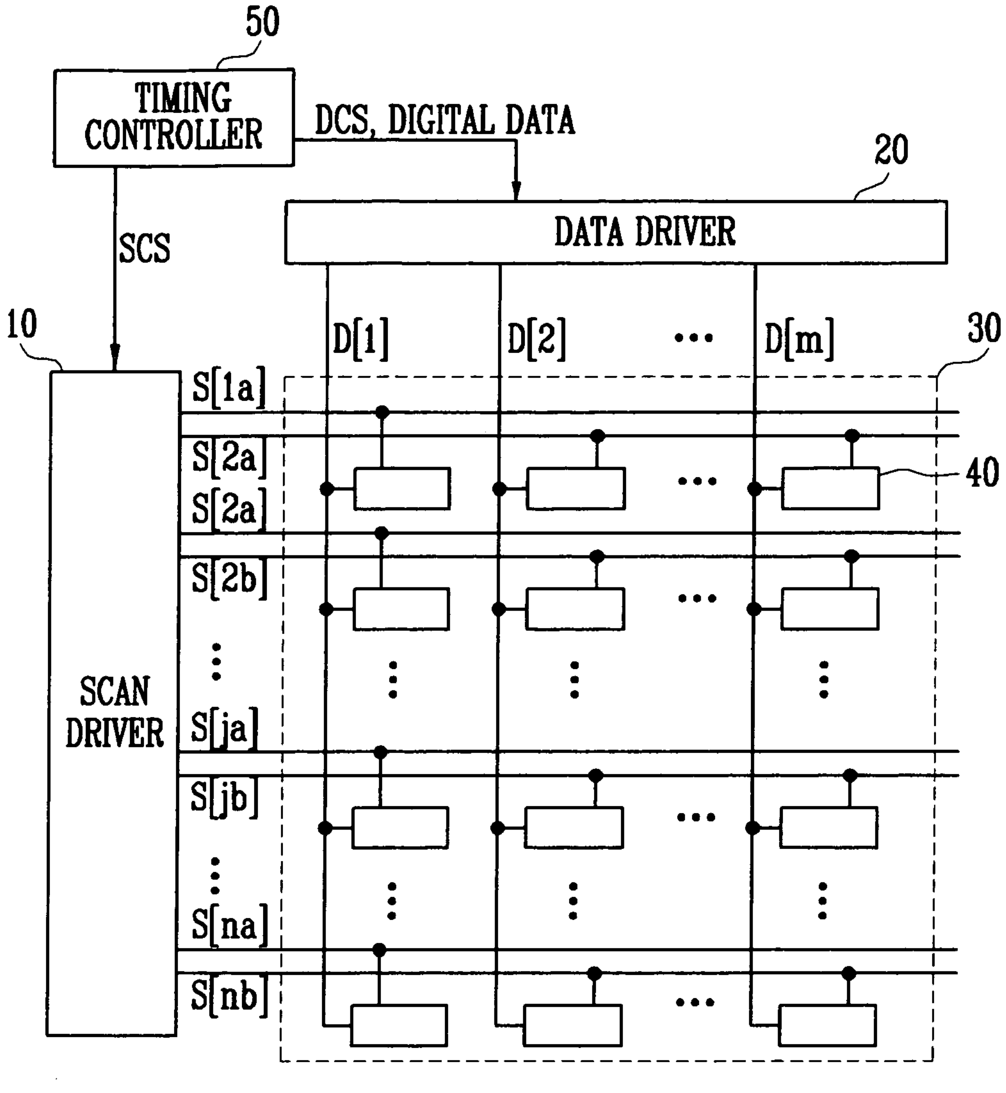
FIG. 9 is a block diagram showing a flat panel display device according to an embodiment of the present invention.

FIG. 9 is a block diagram showing a flat panel display device according to an embodiment of the present invention.

Here, the flat panel display device includes the DAC 300 described above with reference to FIG. 3 to FIG. 6 and the data driver described above with reference to FIG. 8. Therefore, the constitutions and operations of the DAC 300 and the data driver will not be provided again in more detail.

Referring to FIG. 9, the flat panel display device according to the embodiment of the present invention includes: a display region 30 including a plurality of pixels 40 connected to scan lines S[1] to S[n] and data lines D[1] to D[m]; a scan driver 10 for driving the scan lines S[1] to S[n]; a data driver 20 for driving the data lines D[1] to D[m]; and a timing controller 50 for controlling the scan driver 10 and the data driver 20.

The timing controller 50 generates a data driving control signal (DCS) and a scan driving control signal (SCS) in response to synchronizing signals supplied from one or more external sources. The data driving control signal (DCS) generated from the timing controller 50 is supplied to the data driver 20, and the scan driving control signal (SCS) is supplied to the scan driver 10. Also, the timing controller 50 supplies the digital data supplied from an external source to the data driver 20.

The data driver 20 receives the data driving control signal (DCS) from the timing controller 50. Therefore, the data driver 20, receiving the digital data and the data driving control signal (DCS), generates the gray scale voltages corresponding to the digital data and synchronizes the generated gray scale voltages with the scan signals to supply the corresponding gray scale voltages to corresponding or predetermined pixels.

However, when generating the gray scale voltages according to an embodiment of the present invention, the embodiment uses the parasitic capacitance components existing in the at least two data lines of the plurality of data lines provided on the panel as the sampling capacitor and the holding capacitor, thereby generating the desired gray scale voltages through the charge sharing between the data lines.

The structures and the operations of the DAC 300 for generating the gray scale voltage and the data driver have been described above and the description thereof will not be provided again.

However, in case of such a flat panel display device, as described in FIG. 9 and with reference to FIG. 7A above, the scan lines S[j] connected to each pixel need two scan lines S[na], S[nb] for every pixel, and the line time that the scan signals are applied to the respective scan lines is reduced to a half of the existing (or conventional) line time.

That is, in case of an embodiment of the present invention, the sum of the first data line time that the scan signal is applied to the first scan line S[ja] and the second line time that the scan signal is applied to the second scan line S[jb] becomes the existing line time.

However, this describes the case of FIG. 3, that is, the case of generating the gray scale voltages corresponding to one data line by using the two neighboring data lines.

Therefore, in the case of using the sum values of the respective parasitic capacitance components existing in two or more data lines, that is, k (k≥2) data lines as the sampling capacitor and/or the holding capacitor, the line time that the scan signals are applied to the scan line is reduced to 1/k of the existing line time and the scan line S[n] connected to each pixel in the flat panel display device uses k number of scan lines for every pixel. However, in this case, there is a problem in that as the data line time is significantly shortened and the number of the scan lines is increased, an aperture ratio is reduced. Therefore, a method using adjacent scan lines adjacent to and above and/or below a reference scan line may be used by adding switch circuits to pixel circuits within each pixel, without adding the number of the scan lines, as shown in FIG. 7B.

In view of the foregoing, an embodiment of the present invention uses parasitic capacitance components existing in at least two data lines as a holding capacitor and a sampling capacitor to generate desired gray scale voltages through charge sharing between data lines, thereby greatly reducing area and power consumption over an existing R-string type of DAC.

Also, an embodiment of the present invention can remove an R-string, a decoder, and a switch array of the existing DAC, thereby further reducing the area of DAC over the existing R-string type of DAC.

In addition, when manufacturing the data driver by using a SOP process, an embodiment of the present invention has an advantage in that the deterioration of image quality due to a difference of output voltage between channels due to an analog buffer having variation in threshold voltages and mobility can be overcome because the analog buffer does not have to be used as an amplifier.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A digital-analog converter comprising:

a gray scale generator comprising:

a plurality of switches for generating desired gray scale voltages through charge sharing between a sampling capacitor formed by a parasitic capacitance component of a first one of at least two data lines; and a holding capacitor formed by a parasitic capacitance component of a second one of the at least two data lines;

a switching signal generator for providing operation control signals for the plurality of switches of the gray scale generator; and a reference voltage generator for generating one or more reference voltages and for providing the one or more reference voltages to the gray scale generator, wherein the sampling capacitor and the holding capacitor are configured to concurrently sample the one or more reference voltages that are applied between terminals of the sampling capacitor in accordance with input digital data, and wherein a first switch of the plurality of switches is coupled between the first one of the at least two data lines and the second one of the at least two data lines for electrically coupling the holding capacitor and the sampling capacitor together, and the switch is configured to be off when the holding capacitor is initialized with one of the reference voltages.

2. The digital-analog converter as claimed in claim 1, wherein the gray scale generator comprises:

a second switch for controlling one of the reference voltages at a first level to be supplied to the sampling capacitor depending on respective bit values of the input digital data;

a third switch for controlling another one of the reference voltages at a second level to be supplied to the sampling capacitor depending on the respective bit values of the input digital data, the second level being lower than the first level;

and a fourth switch connected to the holding capacitor for initializing the holding capacitor, wherein the first switch is provided between the sampling capacitor and the holding capacitor for applying the charge sharing between the sampling capacitor and the holding capacitor.

3. The digital-analog converter as claimed in claim 1, wherein the at least two data lines are a pair of the data lines adjacent to each other.

4. The digital-analog converter as claimed in claim 1, wherein the at least two data lines comprise two or more data lines for receiving data of a same color.

5. The digital-analog converter as claimed in claim 1, wherein the parasitic capacitance components existing in the at least two data lines are sum values of the respective parasitic capacitance components existing in two or more of the data lines.

6. The digital-analog converter as claimed in claim 2, wherein the second switch, the third switch, and the fourth switch are coupled to a demultiplexer so that reference voltages corresponding to the first one of the at least two data lines or the second one of the at least two data lines are divided and provided.

7. The digital-analog converter as claimed in claim 2, wherein the holding capacitor is initialized with at least one of the reference voltages at the first level or the second level by turning on the fourth switch.

8. The digital-analog converter as claimed in claim 2, wherein the charge sharing between the sampling capacitor and the holding capacitor is executed for a plurality of periods during which each of a plurality of bits of the digital data is input, and wherein a result of the charge sharing executed at a last one of the plurality of periods is applied to the data lines as final ones of the gray scale voltages.

9. The digital-analog converter as claimed in claim 8, wherein the charge sharing evenly distributes the reference voltages stored in the sampling and holding capacitors by turning on the first switch for a period of each of the plurality of periods.

10. The digital-analog converter as claimed in claim 9, wherein the first switch is turned on after a turn on operation of at least one of the second switch or the third switch is completed.

11. The digital-analog converter as claimed in claim 1, wherein the reference voltage generator generates and provides respective first levels and second levels of the reference voltages for red, green, and blue (R, G, B) color, each of the second levels being lower than a corresponding one of the first levels.

12. A data driver comprising:

a shift register unit for providing sampling signals by generating at least one shift register clock;

a sampling latch unit for sampling and latching digital data having a plurality of bits by receiving the sampling signals for every column line;

a holding latch unit for simultaneously receiving and latching digital data latched in the sampling latch unit, and for converting and outputting the digital data in a serial state for every channel; and a digital-analog converter for generating analog gray scale voltages to correspond to bit values of the digital data supplied from the holding latch unit in a serial state and for outputting the gray scale voltages to data lines, and comprising a switch coupled between a first one of at least two data lines and a second one of the at least two data lines for electrically coupling a sampling capacitor formed by a parasitic capacitance component of the first one of the at least two of the data lines and a holding capacitor formed by a parasitic capacitance component of the second one of the at least two of the data lines together, wherein the sampling capacitor and the holding capacitor are configured to concurrently sample a reference voltage that is applied between terminals of the sampling capacitor in accordance with the digital data, and wherein the switch is configured to be off when the holding capacitor is initialized with the reference voltage.

13. The data driver as claimed in claim 12, wherein the holding latch unit receives at least one shift register clock signal generated from the shift register, and converts the digital data received in a parallel state into the serial state in accordance with the at least one shift register clock signal and outputs the digital data in the serial state to the digital-analog converter.

14. The data driver as claimed in claim 12, wherein the digital-analog converter generates the analog gray scale voltages corresponding to the bit values of the digital data input through charge sharing between at least two of the data lines and outputs the gray scale voltages to corresponding pixels connected to the data lines.

15. The data driver as claimed in claim 14, wherein the charge sharing is executed by using the sampling capacitor and the holding capacitor.

16. A flat panel display device comprising:

a display region comprising a plurality of pixels connected with a plurality of scan lines arranged in a first direction and a plurality of data lines arranged in a second direction;

a data driver for supplying analog gray scale voltages to the plurality of pixels; and a scan driver for supplying scan signals to the scan lines, wherein the data driver generates the analog gray scale voltages corresponding to digital data input through charge sharing between a sampling capacitor formed by a parasitic capacitance component of a first one of at least two of the data lines and a holding capacitor formed by a parasitic capacitance component of a second one of the at least two of the data lines and provides the analog gray scale voltages to corresponding ones of the plurality of pixels, wherein the sampling capacitor and the holding capacitor are configured to concurrently sample a reference voltage that is applied between terminals of the sampling capacitor in accordance with the digital data, and wherein the data driver comprises a switch coupled between the first one of the at least two data lines and the second one of the at least two data lines for electrically coupling the sampling capacitor and the holding capacitor together, and the switch is configured to be off when the holding capacitor is initialized with the reference voltage.

17. The flat panel display device as claimed in claim 16, wherein the at least two of the data lines are a pair of the data lines adjacent to each other.

18. The flat panel display device as claimed in claim 16, wherein the at least two of the data lines comprise more than two of the data lines for receiving data of a same color.

19. The flat panel display device as claimed in claim 16, wherein the parasitic capacitance components existing in the at least two of the data lines are sum values of the respective parasitic capacitance components existing in more than two of the data lines.

20. A data driving method of a flat panel display device comprising:

serially inputting each of a plurality of bits of digital data;

executing charge sharing between a sampling capacitor formed by a parasitic capacitance component of a first one of at least two data lines of a plurality of data lines and a holding capacitor formed by a parasitic capacitance component of a second one of the at least two data lines for a plurality of periods during which each of the plurality of bits of the digital data is input, the sampling capacitor and the holding capacitor being configured to concurrently sample a reference voltage that is applied between terminals of the sampling capacitor in accordance with the digital data;

applying a result of the charge sharing executed at a last one of the plurality of periods to corresponding ones of a plurality of pixels through the plurality of data lines as final gray scale voltages; and prior to said executing charge sharing, initializing the holding capacitor with the reference voltage while the sampling capacitor and the holding capacitor are electrically separated by a switch coupled between the first one of the at least two data lines and the second one of the at least two data lines.

21. The data driving method of a flat panel display device as claimed in claim 20, wherein the charge sharing evenly distributes a plurality of reference voltages stored in the sampling and holding capacitors for a period of each of the plurality of periods.

* * * * *